United States Patent
Bonhoure et al.

[11] Patent Number: 6,111,742
[45] Date of Patent: Aug. 29, 2000

[54] IMPLEMENTATION OF AN INTERMETALLIC CAPACITOR

[75] Inventors: Bruno Bonhoure, Grenoble; Véronique Tournier, Seyssinet-Pariset, both of France

[73] Assignee: STMicroelectronics S.A., Gentilly, France

[21] Appl. No.: 09/152,854

[22] Filed: Sep. 14, 1998

[30] Foreign Application Priority Data

Sep. 22, 1997 [FR] France .................................. 97 11966

[51] Int. Cl.[7] ..................................................... H01G 4/00
[52] U.S. Cl. .................. 361/301.2; 361/303; 361/306.1; 361/311; 361/321.5; 438/239
[58] Field of Search ............................... 361/303–306.1, 361/309, 311–313, 320–321.5, 301.2; 29/25.41, 25.42; 257/298, 303, 296; 438/239, 200–210

[56] References Cited

U.S. PATENT DOCUMENTS

| | | | |
|---|---|---|---|
| 5,439,840 | 8/1995 | Jones, Jr. et al. ......................... | 438/3 |
| 5,494,841 | 2/1996 | Dennison et al. ......................... | 437/52 |
| 5,622,882 | 4/1997 | Yee ........................................... | 438/210 |
| 5,670,808 | 9/1997 | Nishihori et al. ........................ | 257/310 |
| 5,684,485 | 11/1997 | Paillardet et al. ....................... | 341/159 |
| 5,691,209 | 11/1997 | Liberkowski .............................. | 437/7 |
| 5,696,510 | 12/1997 | Paillardet et al. ...................... | 341/156 |
| 5,712,813 | 1/1998 | Zhang ..................................... | 365/149 |
| 5,777,533 | 7/1998 | Kato et al. .............................. | 333/185 |
| 5,780,910 | 7/1998 | Hashimoto et al. ..................... | 257/393 |
| 5,815,103 | 9/1998 | Comminges et al. ................... | 341/144 |
| 5,867,066 | 2/1999 | Dell'Ova et al. ......................... | 320/288 |
| 5,926,359 | 7/1999 | Greco et al. ............................. | 361/311 |
| 5,956,262 | 9/1999 | Comminges et al. ................... | 708/319 |

FOREIGN PATENT DOCUMENTS 0 353 414  2/1990  European Pat. Off. ...... H01L 23/522

OTHER PUBLICATIONS

French Search Report for French Patent Application No. 9711966, filed Sep. 22, 1997.
Patent Abstract of Japan, vol. 006, No. 147 (E–123), Aug. 6, 1982 and JP 57 071165, May 1, 1982.
Patent Abstract of Japan, vol. 095, No. 006, Jul. 31, 1995 and JP 058294, Mar. 3, 1995.
Patent Abstract of Japan, vol. 095, No. 008, Sep. 29, 1995 and JP 07 130953, May 19, 1995.
Patent Abstract of Japan, vol. 013, No. 364 and JP 01 120858, May 12, 1989.

*Primary Examiner*—Kristine Kincaid
*Assistant Examiner*—Eric Thomas
*Attorney, Agent, or Firm*—Wolf, Greenfield & Sacks, P.C.; James H. Morris; Theodore E. Galanthay

[57] ABSTRACT

The present invention relates to a method of implementing an intermetallic capacitor in a multiple layer integrated circuit including, on a P-type substrate, at least five levels of metallization. The method includes letting remain, on either side of portions of end metallization levels of the capacitor, at least one portion of a biasable level distinct from the substrate and from the last metallization level, and biasing, at least above the capacitor and to the potential of the substrate, the two biasable portions.

20 Claims, 1 Drawing Sheet

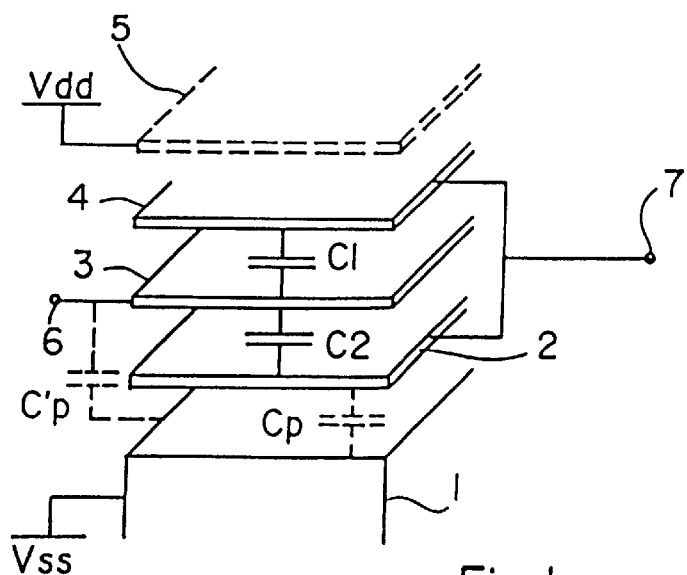
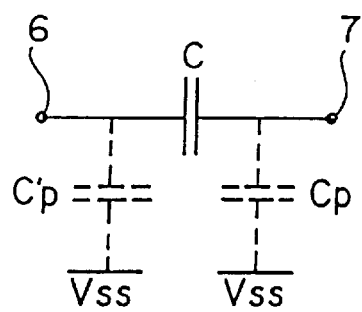
Fig 1
Fig 2
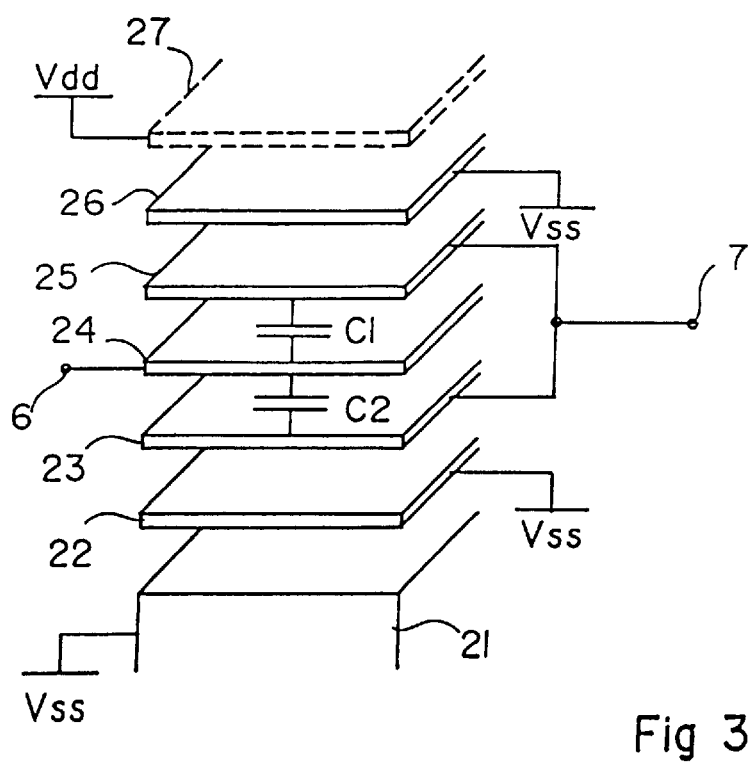
Fig 3

IMPLEMENTATION OF AN INTERMETALLIC CAPACITOR

BACKGROUND OF THE INVENTION

1. Field of the Invention

The present invention relates to the implementation of a capacitor in a multiple layer integrated circuit. The present invention more specifically applies to compound integrated circuits including a digital part and an analog part.

2. Discussion of the Related Art

In a compound integrated circuit in CMOS technology, MOS transistors are generally distributed in distinct blocks according to whether they belong to the analog or digital parts of the circuit. The analog and digital blocks are generally supplied separately from each other, that is, by means of different leads of the integrated circuit.

In an HCMOS technology with several metal layers, a capacitor is generally made between the lower metallization level and the level immediately above. To reduce the surface bulk of the capacitor, a capacitor is generally made by assembly of two symmetrical capacitors on either side of a lower metal layer portion.

FIG. 1 very schematically shows a conventional embodiment of a capacitor in HCMOS technology with several metal layers. Above a P-type substrate 1, in which are formed the MOS transistors, the successive deposition and etching of a polysilicon layer 2 and of several metal layers 3, 4 are provided. A second polysilicon layer may be provided. Each layer is separated from the two neighboring layers by a dielectric layer, generally made of silicon oxide.

In the present invention, "metallization level" is meant to refer to a polysilicon layer or to a metal layer.

In FIG. 1, the capacitor is formed of two intermetallic capacitors C1, C2, respectively between layers 3, 4, and 2, 3. A first terminal 6 of the capacitor is formed of a pad that contacts intermediary layer 3. A second terminal 7 of the capacitor is formed of a contact pad connected to layers 2 and 4, so that capacitors C1 and C2 are in parallel. Other levels are generally provided above level 4, for example, at least one metal layer 5 which is used to form the tracks of connection of the different components to a positive supply potential Vdd. Substrate 1 is at a potential Vss, generally the ground.

Stray capacitances Cp, C'p are respectively present between layer 2 and substrate 1, and between the track of connection of terminal 6 to layer 3 and substrate 1. Similarly, if the etch pattern of layer 5 (or of any other higher metallization level) causes this layer to be present above the implemented capacitor, stray capacitances (not shown) appear between layer 4 and layer 5, and between the connection of terminal 6 to layer 3 and layer 5.

FIG. 2 shows the equivalent schematic electric diagram of capacitor C thus made between terminals 6 and 7. For clarity, only stray capacitances Cp, C'p have been taken into account, on the side of substrate 1.

A problem which arises in the circuit operation is that the charge of capacitor C can be corrupted or changed by noise crossing capacitances Cp, C'p. This problem is particularly critical in compound circuits due to the switching noise from the digital part of the circuit which corrupts the ground and transits through substrate 1 to above the capacitor.

The importance of this problem depends on the signal-to-noise ratio desired for the capacitor, and thus on the importance of the charge level of this capacitor. The lower the charge level to be stored by the capacitor, the greater the influence of switching noise.

It should be noted that the same problem arises for any intermetallic storage capacitor, the charge level of which is not negligible with respect to the switching noise.

SUMMARY OF THE INVENTION

The present invention aims at making intermetallic storage capacitors independent from a switching noise that can pollute the power supplies of the integrated circuit.

More specifically, the present invention aims at providing a novel method of implementing of an intermetallic capacitor in a multiple layer integrated circuit.

A characteristic of the present invention is to let remain, on either side of end metallization levels of an intermetallic capacitor, and before the end metallization levels of the circuit, two portions of biasable layers. Thus, according to the present invention, at least one portion of a biasable layer is present between the substrate and a portion of a first end level of metallization of the capacitor. At the other end of the piling, at least one portion of a biasable layer is present between the portion of the second end level of metallization of the capacitor and a metal layer in which are generally formed the circuit supply tracks.

Another characteristic of the present invention is that both portions of biasable layers are connected to the integrated circuit ground. Accordingly, the present invention interposes, in the circuit thickness, two cold regions on either side of the intermetallic capacitor.

An example application to which the present invention relates is that of analog-to-digital converters using so-called "auto-zeroing" comparators which require a storage capacitor in the sampling.

In such a converter, the smallest quantifiable element is a function of the value of the reference voltage and of the number of bits of the converter. For example, for a reference voltage on the order of 1.5 volts, the smallest quantifiable element is, in the case of an 8-bit converter, on the order of 6 to 7 millivolts. The noise introduced by the stray capacitances is substantially independent from the supply voltage, and thus from the reference voltage. Accordingly, a decrease in the value of the smallest quantifiable element alters the signal-to-noise ratio, while the miniaturization of integrated circuits leads to decreasing the supply voltages to reduce the consumed power.

More specifically, the present invention provides a method of implementation of an intermetallic capacitor in a multiple layer integrated circuit including, from a P-type substrate, at least five metallization levels, this method including the steps of:

letting remain, on either side of portions of end metallization levels of the capacitor, at least one portion of a biasable level distinct from the substrate and from the last metallization level; and biasing, at least above the capacitor and to the potential of the substrate, the two biasable portions.

According to an embodiment of the present invention, the capacitor is formed of three metallization levels, a first terminal of the capacitor being formed by a contact to the intermediary level, and a second terminal being formed by a contact common to the end levels of the capacitor.

The present invention also provides an intermetallic capacitor implemented in a multiple layer integrated circuit including, from a P-type substrate, at least five metallization levels, the two levels defining end portions of the capacitor being separated, respectively, from the substrate and from a last metallization level, by a portion of a biasable level.

According to an embodiment of the present invention, each biasable portion is connected to the substrate potential.

According to an embodiment of the present invention, applied to the implementation of an intermetallic capacitor in a compound integrated circuit, the biasable portions are connected directly to the analog ground of the integrated circuit.

According to an embodiment of the present invention, the capacitor is implemented, in a circuit in HCMOS technology including one polysilicon layer and five metal layers, between the first, second, and third metal layers.

The foregoing features and advantages of the present invention will be discussed in detail in the following non-limiting description of specific embodiments made in connection with the accompanying drawings.

BRIEF DESCRIPTION OF THE DRAWINGS

FIGS. 1 and 2, previously described, are meant to show the state of the art and the problem to solve; and FIG. 3 schematically shows an embodiment of an intermetallic capacitor according to the present invention.

DETAILED DESCRIPTION

For clarity, only those elements necessary to the understanding of the present invention have been shown in the drawings and will be described hereafter.

FIG. 3 shows an embodiment of an intermetallic capacitor according to the present invention.

The embodiment shown in FIG. 3 is implemented in a technology including six levels of metallization, that is, from a substrate 21, one polysilicon layer 22 and five metal layers 23, 24, 25, 26, and 27. In such a technology, an intermetallic capacitor according to the present invention is formed between the first, second, and third metal layers 23, 24, and 25. As previously, to minimize the surface bulk of the capacitor, capacitors C1 and C2 are associated in parallel, a first terminal 6 of the capacitor being defined by a contact at layer 24, and a second terminal 7 being defined by a contact common to layers 23 and 25.

Upper metal layer 27 is, for example, the layer in which the positive supply tracks of the integrated circuit components are made.

According to the present invention, the portion of metallization level (here, polysilicon layer 22) present between substrate 21 and layer 23 above the intermetallic capacitor, is biased to potential Vss, that is, the ground. Similarly, fourth metal layer 26 is, at least in its portion above the capacitor, biased to potential Vss.

The connection of polysilicon layer 22 to the ground prevents the propagation of switching noise transiting through substrate 21 to the capacitor.

The connection of fourth metal layer 26 to the ground protects the capacitor from layer 27 biased to Vdd, and thus from positive switching peaks.

Preferably, the biasings of layers 22 and 26 are performed by the ground of the analog part of the integrated circuit which is much less corrupted or affected by switching noise than the ground of the digital part.

An advantage of the present invention is that the inteimetallic capacitor is enclosed between two levels, distinct from the substrate and from the upper metallization layer in which the supplies are performed. By biasing these two levels to the ground, the capacitor becomes enclosed between two cold regions, which isolates it from the stray capacitances between substrate 21 and the first metallization level and between the last metallization level 27 and the penultimate metallization level 26.

Indeed, since layer 22 is directly connected to the ground by a pad, the loads are evacuated and there is no coupling between layer 22 and layer 23. Further, the stray capacitance (C'p, FIG. 1) between the connection of layer 24 to terminal 6 and substrate 21 is reduced or eliminated.

On the positive supply side, the direct connection of layer 26 to the ground by means of a pad has the effect that this connection exhibits a much lower impedance than the indirect connection via the stray capacitance between layers 26 and 27. Thus, although the stray capacitances have the same order of magnitude, the ground brought in by layer 26 contains no noise. As a specific example, the order of magnitude of a stray intermetallic capacitance is on the order of 20 to 100 femptofarad, and the impedance of the lines of connection to the ground is on the order of a few ohms. Accordingly, for an operating frequency of an analog-to-digital converter which is generally on the order of a few tens of MHz, the impedance of the lines of connection to the ground is perfectly negligible with respect to that of the stray capacitance.

It should be noted that the present invention also applies to the implementation of an intermetallic capacitor in a technology including one polysilicon layer and four metal layers. In this case, the capacitor is however made between two metallization levels only to frame this capacitor with two grounded levels, distinct from the substrate and from the last metal layer receiving the positive supply. Similarly, the present invention applies to a circuit including more than five metal layers.

Of course, the present invention is likely to have various alterations, modifications, and improvements which will readily occur to those skilled in the art. In particular, although reference has been made in the foregoing description to capacitors applied to analog-to-digital converters, the present invention may be used in any application for which a capacitor is used for charge transfer and in which it is desired to improve the signal-to-noise ratio.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. An intermetallic capacitor implemented in a multiple layer integrated circuit, the integrated circuit comprising:
   a substrate;
   a first biasable portion of a first layer and a second biasable portion of a second layer both of which are distinct from said substrate;
   an intermetallic capacitor including at least two metal layers being located between and being electrically insulated from said first biasable portion of the first layer and said second biasable portion of the second layer; and
   a last metallization level located above said second biasable portion of the second layer, said first biasable portion and said second biasable portion being connected to a potential different from a potential of any one of the metal layers of the intermetallic capacitor.

2. The integrated circuit of claim 1, wherein each said biasable portion is connected to a substrate potential.

3. The integrated circuit of claim 1, implemented in a compound integrated circuit, wherein the biasable portions are connected directly to an analog ground of the integrated circuit.

4. The integrated circuit of claim 3, wherein the compound integrated circuit includes a digital part and an analog part.

5. The integrated circuit of claim 1, implemented, in a circuit in HCMOS technology wherein the first biasable portion includes polysilicon and the other layers are formed by metallization.

6. The integrated circuit of claim 1, wherein the first and second biasable layers are metallization layers.

7. The integrated circuit of claim 1, wherein the intermetallic capacitor includes a third capacitor metal layer, said three capacitor metal layers being arranged as two capacitors in parallel forming the intermetallic capacitor.

8. The integrated circuit of claim 7, wherein the first and second biasable layers are metallization layers.

9. The integrated circuit of claim 1, wherein said substrate is a P-type substrate.

10. The integrated circuit of claim 1, wherein the last metallization level is connected to a supply voltage.

11. The integrated circuit of claim 1, wherein the last metallization level is connected to a positive voltage of a power supply and wherein said second biasable portion of the second layer is directly connected to the ground.

12. A multiple layer integrated circuit, comprising:
   a P-type substrate;
   a first biasable portion of a first layer and a second biasable portion of a second layer both of which being distinct from said substrate;
   an intermetallic capacitor arranged as a storage capacitor, the intermetallic capacitor including three metal layers located between and being electrically insulated from said first biasable portion of the first layer and said second biasable portion of the second layer; and
   a last metallization level located above said second biasable portion of the second layer and connected to a positive voltage of a power supply, said first biasable portion and said second biasable portion being connected to a potential different from a potential of any one of the metal layers of the intermetallic capacitor.

13. The integrated circuit of claim 12, arranged for use with an analog-to-digital converter, wherein said storage capacitor is associated with an auto-zeroing comparator.

14. The integrated circuit of claim 12, including a digital part and an analog part and wherein said first biasable portion of the first layer and said second biasable portion of the second layer are connected to an analog ground of the integrated circuit.

15. The integrated circuit of claim 12, wherein each said biasable portion is connected to a substrate potential.

16. A method of implementing an intermetallic capacitor in a multiple layer integrated circuit, comprising the steps of:
   providing a P-type substrate;
   fabricating a first biasable portion of a first layer that is distinct from said substrate;
   fabricating metallization levels and forming an intermetallic capacitor;
   fabricating a second biasable portion of a second layer;
   fabricating a last metallization level and connecting said last metallization level to a supply voltage, said second biasable portion of said second layer being distinct from the last metallization level; and
   creating biasing for the two biasable portions at a potential different from a potential of any one of the levels of the intermetallic capacitor.

17. The method of claim 16, wherein the fabricating of the capacitor includes forming three said metallization levels, a first terminal of the capacitor being formed by a contact to an intermediary level of said three metallization levels, and a second terminal being formed by a contact common to end levels of said three metallization levels of the capacitor.

18. The integrated circuit of claim 1, implemented, in a circuit in HCMOS technology wherein the first biasable portion includes polysilicon and the other layers are formed by metallization.

19. The method of claim 16, wherein the step of creating biasing includes biasing said first biasable portion of the first layer and said second biasable portion of the second layer to a substrate potential.

20. The method of claim 16, wherein the multiple layer integrated circuit includes a compound integrated circuit with an analog part and a digital part, and wherein the step of creating biasing includes biasing said first biasable portion of the first layer and said second biasable portion of the second layer directly to an analog ground of the integrated circuit.

* * * * *